(12) United States Patent
Hirai et al.

(10) Patent No.: US 10,539,600 B2
(45) Date of Patent: Jan. 21, 2020

(54) SEMICONDUCTOR DEVICE AND AC RESISTANCE MEASURING SYSTEM INCLUDING THE SAME

(71) Applicant: Renesas Electronics Corporation, Tokyo (JP)

(72) Inventors: Masato Hirai, Tokyo (JP); Siewling Lim, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/853,834

(22) Filed: Sep. 14, 2015

(65) Prior Publication Data

US 2016/0091543 A1   Mar. 31, 2016

(30) Foreign Application Priority Data

Sep. 25, 2014   (JP) .................................. 2014-194718

(51) Int. Cl.
| | | |
|---|---|---|
| *G01R 27/14* | (2006.01) | |
| *G01R 31/28* | (2006.01) | |
| *H02J 3/00* | (2006.01) | |

(52) U.S. Cl.
CPC ......... *G01R 27/14* (2013.01); *G01R 31/2879* (2013.01); *H02J 3/00* (2013.01)

(58) Field of Classification Search
CPC ........ G01R 27/14; G01R 31/2879; H02J 3/00
See application file for complete search history.

(56) References Cited

U.S. PATENT DOCUMENTS

| | | | | |
|---|---|---|---|---|
| 4,305,001 A | * | 12/1981 | Vamaraju | .................. H02P 9/42 290/5 |
| 5,485,059 A | * | 1/1996 | Yamashita | ......... H05B 41/2925 315/119 |
| 8,975,899 B2 | * | 3/2015 | Wolf | ....................... H02M 7/48 324/519 |

(Continued)

FOREIGN PATENT DOCUMENTS

| | | |
|---|---|---|
| JP | S55-50344 A | 4/1980 |
| JP | H 11-113872 A | 4/1999 |

OTHER PUBLICATIONS

Japanese Office Action dated Jun. 5, 2018 in corresponding Japanese Application No. 2014-194718 with an English translation thereof.

(Continued)

*Primary Examiner* — Jeff W Natalini
(74) *Attorney, Agent, or Firm* — McDermott Will & Emery LLP

(57) ABSTRACT

Provided is a semiconductor device including: an AC voltage generation unit that generates an AC voltage having an amplitude according to a control signal; a resistance element provided in series with a measurement target, the AC voltage being applied to the resistance element; a voltage detecting unit that detects that a difference voltage between two ends of the resistance element has reached a specified voltage; and a control unit that outputs the control signal to the AC voltage generation unit to cause the AC voltage generation unit to generate the AC voltage so that the difference voltage reaches the specified voltage, based on a detection result of the voltage detecting unit.

17 Claims, 6 Drawing Sheets

(56) References Cited

U.S. PATENT DOCUMENTS

2005/0033192 A1* 2/2005 Takehara ............. A61B 5/0537
600/551
2010/0265747 A1* 10/2010 Egiziano ................... G05F 1/67
363/132

OTHER PUBLICATIONS

Taiwan Office Action dated Nov. 29, 2018 in corresponding Taiwanese Patent Application No. 104128136, with an English translation thereof.

* cited by examiner

SEMICONDUCTOR DEVICE AND AC RESISTANCE MEASURING SYSTEM INCLUDING THE SAME

CROSS-REFERENCE TO RELATED APPLICATIONS

This application is based upon and claims the benefit of priority from Japanese patent application No. 2014-194718, filed on Sep. 25, 2014, the disclosure of which is incorporated herein in its entirety by reference.

BACKGROUND

The present invention relates to a semiconductor device and an AC resistance measuring system including the semiconductor device. For example, the present invention relates to a semiconductor device suitable for preventing an increase in circuit size, and an AC resistance measuring system including the semiconductor device.

A measuring device for measuring the body composition of body fat or the like measures an AC voltage obtained when an AC reference current is caused to flow through a measurement target, such as a foot, and calculates the AC resistance of the measurement target based on the measurement result. The body composition of body fat or the like is estimated based on the AC resistance thus obtained.

A technique for measuring body fat is disclosed in, for example, Japanese Unexamined Patent Application Publication No. H11-113872. A structure disclosed in Japanese Unexamined Patent Application Publication No. H11-113872 measures an AC voltage of a measurement target (an output voltage of an amplifier circuit) by using an AD converter.

SUMMARY

In the structure disclosed in Japanese Unexamined Patent Application Publication No. H11-113872, the range of the AC voltage of the measurement target is wide, which necessitates the use of a high-resolution AD converter to measure the AC voltage. A ΔΣ-type AD converter is known as a typical high-resolution AD converter. The sampling frequency of the ΔΣ-type AD converter is lower than the sampling frequency of a general AD converter. Accordingly, the sampling frequency of the ΔΣ-type AD converter is more likely to be lower than the frequency of the AC voltage of the measurement target. In this case, the ΔΣ-type AD converter cannot directly measure the AC voltage of the measurement target. Therefore, it is necessary to detect the AC voltage of the measurement target, smooth and convert the AC voltage into a DC voltage, and then measure the DC voltage.

In other words, the structure disclosed in Japanese Unexamined Patent Application Publication No. H11-113872 needs to include not only a high-resolution AD converter, but also a detector that detects an AC voltage of a measurement target and a smoothing circuit that performs smoothing. This causes a problem in that a circuit size increases. Other problems to be solved and novel features of the present invention will become apparent from the following description and the accompanying drawings.

A first aspect of the present invention is a semiconductor device including: an AC voltage generation unit that generates an AC voltage having an amplitude according to a control signal; a resistance element provided in series with a measurement target, the AC voltage being applied to the resistance element; a voltage detecting unit that detects that a difference voltage between two ends of the resistance element has reached a specified voltage; and a control unit that outputs the control signal to the AC voltage generation unit to cause the AC voltage generation unit to generate the AC voltage so that the difference voltage reaches the specified voltage, based on a detection result of the voltage detecting unit.

According to the first aspect of the invention, it is possible to provide a semiconductor device capable of preventing an increase in circuit size, and an AC resistance measuring system including the semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
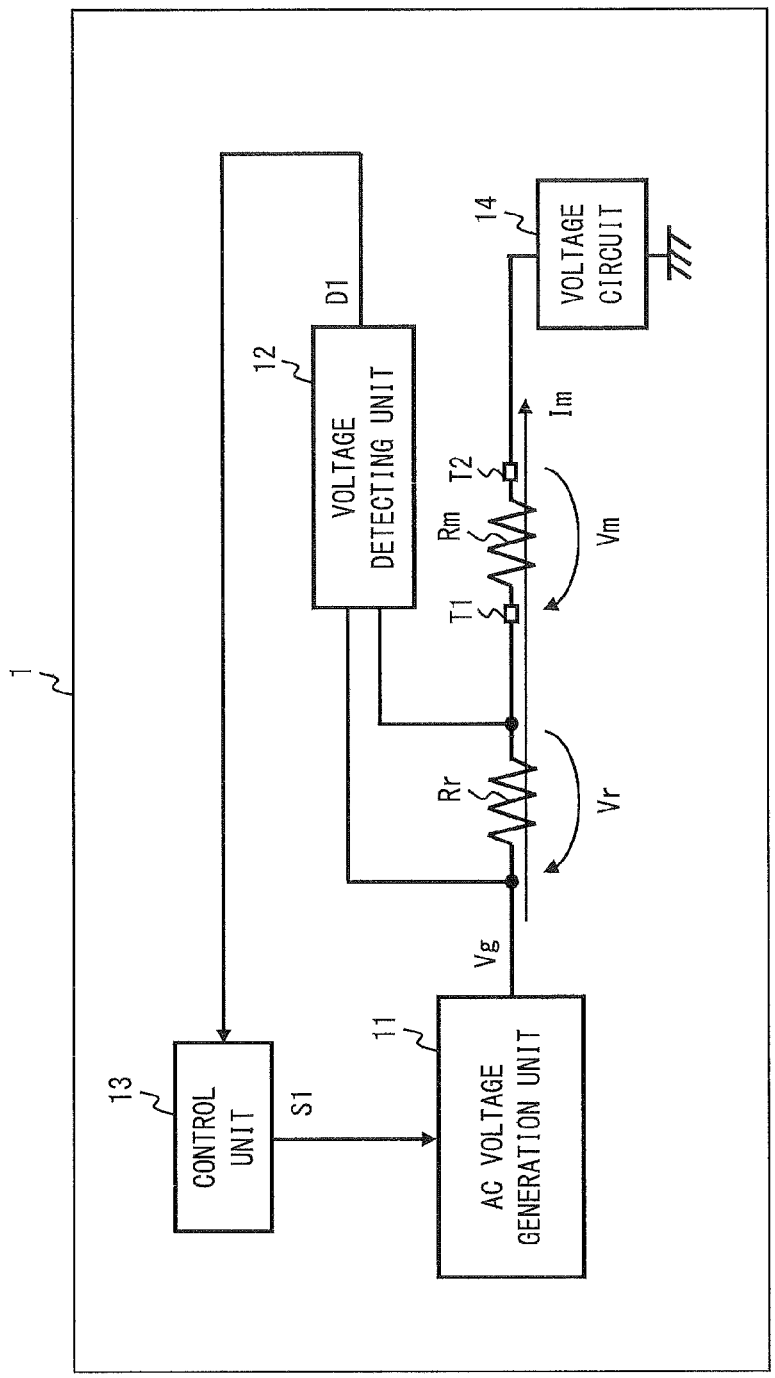
FIG. 1 is a block diagram showing a configuration of a semiconductor device according to a first embodiment.

Hereinafter, embodiments will be described with reference to the accompanying drawings. The drawings are made in a simplified manner, and therefore the technical scope of embodiments of the invention should not be narrowly interpreted based on the drawings. The same components are denoted by the same reference numerals, and duplicate descriptions thereof are omitted.

In the following embodiments, when necessary, the present invention is explained by using separate sections or separate embodiments. However, those embodiments are not unrelated to each other, unless otherwise specified. That is, they are related in such a manner that one embodiment is a modified example, an application example, a detailed explanation, or a supplementary explanation of a part or the whole of another embodiment. Further, in the following embodiments, when the number of elements or the like (including the number of pieces, numerical values, quantity, range, etc.) is mentioned, the number thereof is not limited to a specific number and may be greater than or less than or equal to the specific number unless otherwise specified in particular and definitely limited to the specific number in principle. That is, a larger number or a smaller number than the specific number may also be used.

Further, in the following embodiments, the components (including operation steps, etc.) are not necessarily indispensable except for cases where a component is explicitly specified or a component is obviously indispensable based on its principle. Similarly, in the following embodiments, when a shape, a position relation, or the like of a component(s) or the like is mentioned, shapes or the like that are substantially similar to or resemble that shape are also included in that shape or the like except for cases where that shape or the like is explicitly specified or such shapes and the like are eliminated based on the principle of that shape. This is also true for the above-mentioned number or the like (including the number of pieces, numerical values, quantity, range, etc.).

First Embodiment

FIG. 1 is a block diagram showing a semiconductor device 1 according to a first embodiment.

The semiconductor device 1 according to the first embodiment is applied to, for example, a measuring device that measures the body composition of body fat or the like. The semiconductor device 1 according to the first embodiment includes a resistance element which is provided in series with a measurement target, such as a foot. An AC voltage is applied to the resistance element. The semiconductor device 1 measures the AC voltage obtained when the voltage generated between the two ends of the resistance element reaches a specified voltage. The resistance value of the measurement target can be calculated based on an amplitude value of the measured AC voltage, a predetermined resistance value of the resistance element, and a value of an alternating current flowing through the resistance element. Further, the body composition can be estimated from the calculated resistance value of the measurement target. Thus, there is no need for the semiconductor device 1 according to the first embodiment to measure the AC voltage of the measurement target by using a high-resolution AD converter such as a $\Delta\Sigma$-type AD converter. This eliminates the need for providing a detector and a smoothing circuit. As a result, an increase in circuit size can be prevented. This configuration will be described in detail below.

As shown in FIG. 1, the semiconductor device 1 includes an AC voltage generation unit 11, a voltage detecting unit 12, a control unit 13, a voltage circuit (reference voltage generation circuit) 14, and a resistance element Rr. FIG. 1 also shows a measurement target Rm which is provided so as to be in contact with electrodes T1 and T2.

The AC voltage generation unit 11 generates an AC voltage Vg having an adjustable amplitude. Specifically, the AC voltage generation unit 11 generates the AC voltage Vg having an amplitude according to a control signal S1.

(A Configuration Example of the AC Voltage Generation Unit 11)

Figure 2:
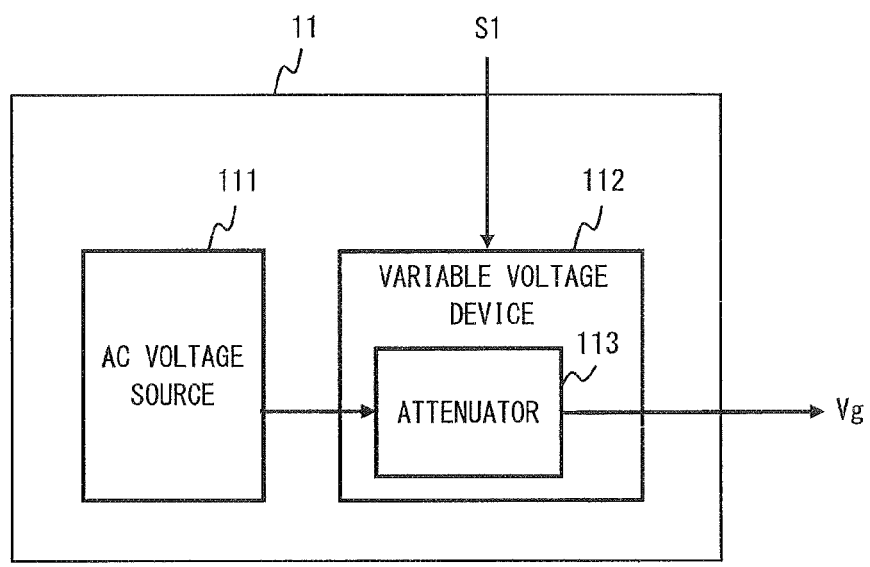
FIG. 2 is a block diagram showing a configuration example of an AC voltage generation unit provided in the semiconductor device shown in FIG. 1.

FIG. 2 is a block diagram showing a configuration example of the AC voltage generation unit 11.

As shown in FIG. 2, the AC voltage generation unit 11 includes an AC voltage source 111 that generates an AC voltage having a predetermined amplitude, and a variable voltage device 112 that amplifies the AC voltage, which is output from the AC voltage source 111, with an amplitude according to the control signal S1, and outputs the amplified AC voltage as the AC voltage Vg.

The AC voltage source 111 is composed of, for example, a waveform generator having a DA converter mounted thereon, a PWM device, or a PFM device, and a low-pass filter that shapes the waveform of an output of any one of the waveform generator, the PWM device, and the PFM device into a sine wave alternating current. The variable voltage device 112 is composed of a variable amplifier circuit or an attenuator. The first embodiment illustrates an example in which the variable voltage device 112 is composed of an attenuator 113.

Returning to FIG. 1, the resistance element Rr is provided in series with the measurement target Rm. In other words, the resistance element Rr and the measurement target Rm are provided in series between the AC voltage generation unit 11 and the voltage circuit 14. The voltage circuit 14 is a circuit that generates a reference voltage. The first embodiment illustrates an example in which the reference voltage is an intermediate voltage between a power supply voltage and a ground voltage GND (=(power supply voltage+ground voltage)/2).

Specifically, the resistance element Rr is provided between the AC voltage generation unit 11 and the electrode T1 which is one of the electrodes in contact with the measurement target Rm. The electrode T2, which is the other one of the electrodes in contact with the measurement target Rm, is connected to the voltage circuit 14.

The AC voltage Vg from the AC voltage generation unit 11 is applied to one end of a current path that passes through the resistance element Rr and the measurement target Rm (i.e., one end of the resistance element Rr in this case). The reference voltage from the voltage circuit 14 is applied to the other end of the current path (i.e., the electrode T2 side of the measurement target Rm in this case). Accordingly, an alternating current Im flows through the resistance element Rr and the measurement target Rm.

The voltage detecting unit 12 detects whether a difference voltage Vr between the two ends of the resistance element Rr has reached a specified voltage Vref. For example, when the difference voltage Vr has not reached the specified voltage Vref, the voltage detecting unit 12 sets a detection result D1 to be inactive (for example, an L-level), and when the difference voltage Vr has reached the specified voltage Vref, the voltage detecting unit 12 sets the detection result D1 to be active (for example, a H-level).

The control unit 13 is, for example, a microcomputer, and outputs the control signal S1 according to the detection result of the voltage detecting unit 12. Specifically, the control unit 13 outputs the control signal S1 to the AC voltage generation unit 11 to generate the AC voltage Vg having an amplitude at which the detection result D1 becomes active (that is, the difference voltage Vr reaches the specified voltage Vref).

(Operation of the Semiconductor Device 1)

Next, an operation of the semiconductor device 1 will be described.

Figure 3:
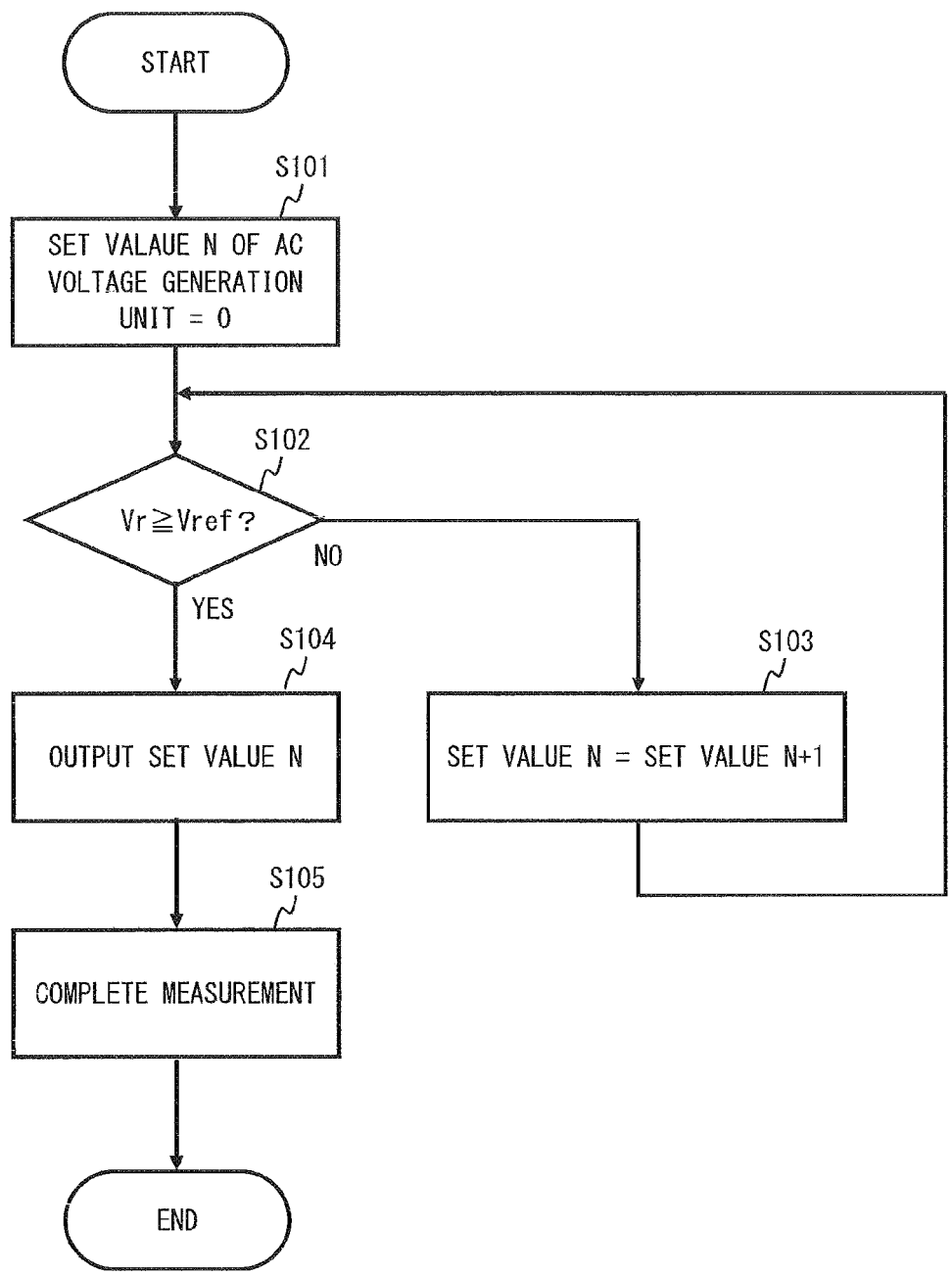
FIG. 3 is a flowchart showing an operation of the semiconductor device shown in FIG. 1.

FIG. 3 is a flowchart showing an operation of the semiconductor device 1.

As shown in FIG. 3, a set value N of the AC voltage generation unit 11 is set to 0 in an initial state (step S101). The set value N represents the magnitude of the amplitude of the AC voltage Vg. The greater the set value N is, the larger the amplitude of the AC voltage Vg is. Accordingly, the amplitude of the AC voltage Vg is small in the initial state.

At this time, if the difference voltage Vr has not reached the specified voltage Vref (No in step S102), the detection result D1 of the voltage detecting unit 12 indicates inactive. Accordingly, the control unit 13 increases the set value N of the AC voltage generation unit 11 by one (step S103). As a result, the magnitude of the AC voltage Vg is increased by one step.

After that, if the difference voltage Vr has not reached the specified voltage Vref (NO in step S102), the detection result D1 of the voltage detecting unit 12 remains inactive. Accordingly, the control unit 13 further increases the set value N of the AC voltage generation unit 11 by one (step S103). As a result, the amplitude of the AC voltage Vg is further increased by one step.

The control unit 13 repeats the operation from "NO" in step S102 to step S103 until the difference voltage Vr reaches the specified voltage Vref and the detection result D1 of the voltage detecting unit 12 is switched from inactive to active. Specifically, the control unit 13 continuously outputs the control signal S1 so as to gradually increase the amplitude of the AC voltage Vg until the difference voltage Vr reaches the specified voltage Vref.

When the difference voltage Vr has reached the specified voltage Vref (YES in step S102), the detection result D1 of the voltage detecting unit 12 is switched from inactive to active. Accordingly, the control unit 13 outputs the control signal S1, for example, so as not to change the amplitude of the AC voltage Vg any more. Further, the control unit 13 outputs information about the set value N obtained at that time to the AC voltage generation unit 11 (step S104).

Specifically, when the voltage detecting unit 12 detects that the difference voltage Vr has reached the specified voltage Vref, the control unit 13 outputs, to the AC voltage generation unit 11, information about the set value N obtained at that time, i.e., information about the amplitude value of the AC voltage Vg obtained at that time. Instead of the AC voltage generation unit 11, the control unit 13 may directly output the information about the set value N (information about the amplitude value of the AC voltage Vg).

Thus, the measurement is completed (step S105).

In this case, the resistance value of the measurement target Rm can be calculated based on the amplitude value of the AC voltage Vg, the resistance value of the resistance element Rr, and the value of the alternating current Im flowing through the resistance element Rr, each of which is measured when the difference voltage Vr has reached the specified voltage Vref. This will be described in detail below using expressions.

First, the relationship among the AC voltage Vg, the difference voltage Vr between the two ends of the resistance element Rr, and the difference voltage Vm between the two ends of the measurement target Rm (between the electrodes T1 and T2) is represented by the following Expression (1).

$$Vg = Vr + Vm \quad (1)$$

Note that the difference voltage Vr has reached the specified voltage Vref and is fixed (Vr≈Vref). Accordingly, the alternating current Im flowing through the resistance element Rr at this time is also fixed (Im≈Vr/Rr).

Since the alternating current Im flows through the measurement target Rm in the same manner as the alternating current Im flows through the resistance element Rr, the relationship among the resistance value (Rm) of the measurement target Rm, the alternating current Im, and the difference voltage Vm is represented by the following Expression (2).

$$Vm = Rm \times Im \quad (2)$$

After Expression (2) is substituted into Expression (1), Expression (3) is obtained.

$$Vg = Vr + (Rm \times Im) \quad (3)$$

Based on Expression (3), the resistance value (Rm) of the measurement target Rm can be represented by the following Expression (4).

$$Rm = (Vg - Vr)/Im \quad (4)$$

As is seen from Expression (4), when the voltage detecting unit 12 detects that the difference voltage Vr has reached the specified voltage Vref, the difference voltage Vr indicates the specified voltage Vref and the alternating current Im indicates the value determined by Vr/Rr. Therefore, the resistance value (Rm) of the measurement target RM can be calculated merely by measuring the AC voltage Vg at that time. Further, the body composition can be estimated from the calculated resistance value Rm.

For example, assuming that the resistance value of the resistance element Rr is 100Ω, the value of the alternating current Im is 500 µA (1.414 mApp), and the value of the AC voltage Vg is 500 mVpp, the resistance value (Rm) of the measurement target Rm is expressed as follows based on Expression (4).

$$Rm = \{500[mVpp] - (100[\Omega] \times 1.414[mApp])\}/1.414[mApp] = 253.6[\Omega]$$

In this manner, the semiconductor device 1 according to the first embodiment measures the AC voltage Vg when the voltage Vr generated between the two ends of the resistance element Rr, which is provided in series with the measurement target Rm, such as a foot, has reached the specified voltage Vref. The resistance value of the measurement target Rm can be calculated based on the amplitude value of the AC voltage Vg which is measured at this time, the predetermined resistance value of the resistance element Rr, and the value of the alternating current Im flowing through the resistance element Rr. Further, the body composition can be estimated from the calculated resistance value of the measurement target Rm. This eliminates the need for the semiconductor device 1 according to the first embodiment to measure the AC voltage of the measurement target by using a high-resolution AD converter, such as a ΔΣ system. Therefore, there is no need for the semiconductor device 1 according to the first embodiment to include a detector and a smoothing circuit. Consequently, both an increase in circuit size and an increase in power consumption can be prevented.

(An AC Resistance Measuring System Including the Semiconductor Device 1)

Figure 4:
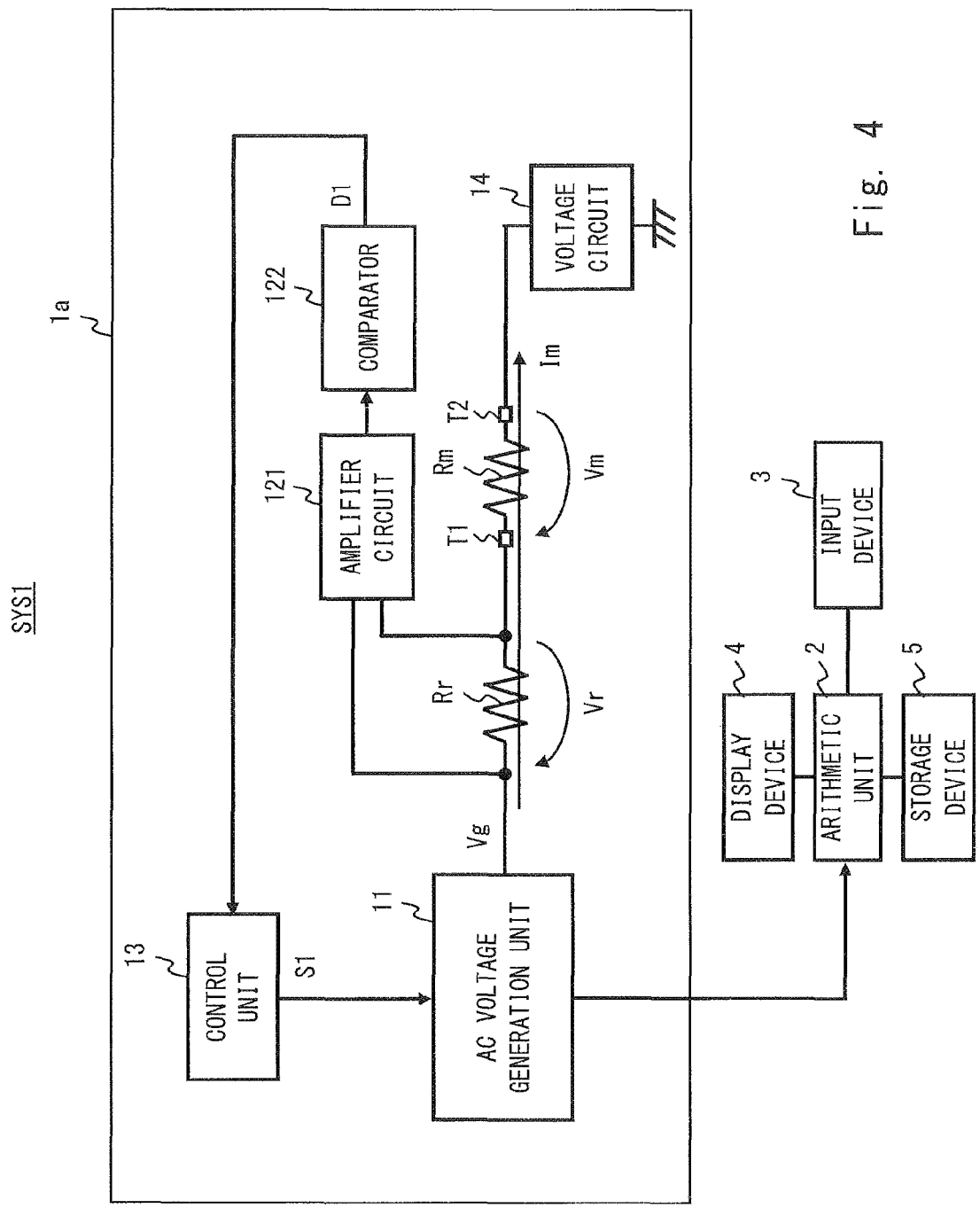
FIG. 4 is a diagram showing a configuration example of an AC resistance measuring system including the semiconductor device shown in FIG. 1.

FIG. 4 is a diagram showing a configuration example of an AC resistance measuring system SYS1 including the semiconductor device 1. FIG. 4 shows a semiconductor device 1a as a specific configuration example of the semiconductor device 1.

As shown in FIG. 4, the AC resistance measuring system SYS1 includes the semiconductor device 1a, an arithmetic unit (arithmetic processing unit) 2, an input device 3, a display device 4, and a storage device 5.

The input device 3 is a device that inputs information necessary for estimation of the body composition of body fat or the like. The arithmetic unit 2 is a unit that calculates the resistance value of the measurement target Rm from the measurement result (for example, information about the set value N) obtained by the semiconductor device 1a, and estimates the body composition from the calculated resistance value of the measurement target Rm. The display device 4 is a device that displays the body composition of body fat or the like which is estimated by the arithmetic unit 2. The storage device 5 is a device that stores previous data and stores operation programs for the arithmetic unit 2.

The semiconductor device 1a includes an amplifier circuit 121 and a comparator 122 as the voltage detecting unit 12. The amplifier circuit 121 amplifies the difference voltage Vr between the two ends of the resistance element Rr. The comparator 122 compares the amplified difference voltage Vr with the specified voltage Vref, and outputs the comparison result as the detection result D1. For example, when the amplified difference voltage Vr is lower than the specified voltage Vref, the comparator 122 outputs the detection result D1 indicating the L-level, and when the amplified difference voltage Vr is equal to or higher than the specified voltage Vref, the comparator 122 outputs the detection result D1 indicating the H-level. The other components and operation of the semiconductor device 1a are similar to those of the semiconductor device 1, and thus a description thereof is omitted.

Although the first embodiment illustrates an example in which the voltage detecting unit 12 includes the amplifier circuit 121 and the comparator 122, the present invention is not limited to this example. If the value of the difference voltage Vr between the two ends of the resistance element Rr is large to some extent, the voltage detecting unit 12 need not necessarily include the amplifier circuit 121.

The voltage detecting unit 12 may include an AD converter 123 instead of the comparator 122. The AD converter 123 converts the difference voltage Vr or the amplified difference voltage Vr into a digital value and outputs the digital value as the detection result D1. In this case, the control unit 13 can rapidly set the set value N of the AC voltage generation unit 11 to an optimum value based on the detection result D1, and thus can effectively adjust the difference voltage Vr to the specified voltage Vref. The AD converter 123 may have a sampling frequency higher than the frequency of the AC voltage Vm generated in the measurement target Rm. For example, when the frequency of the AC voltage Vm is 50 kHz, the AD converter 123 may have a sampling frequency equal to or higher than 50 ksps. That is, it is not necessary to use a high-resolution AD converter as the AD converter 123. Instead, for example, an SAR-type AD converter incorporating a general-purpose MCU may be used. In this case, it is not necessary to provide the detector and the smoothing circuit.

Second Embodiment

Figure 5:
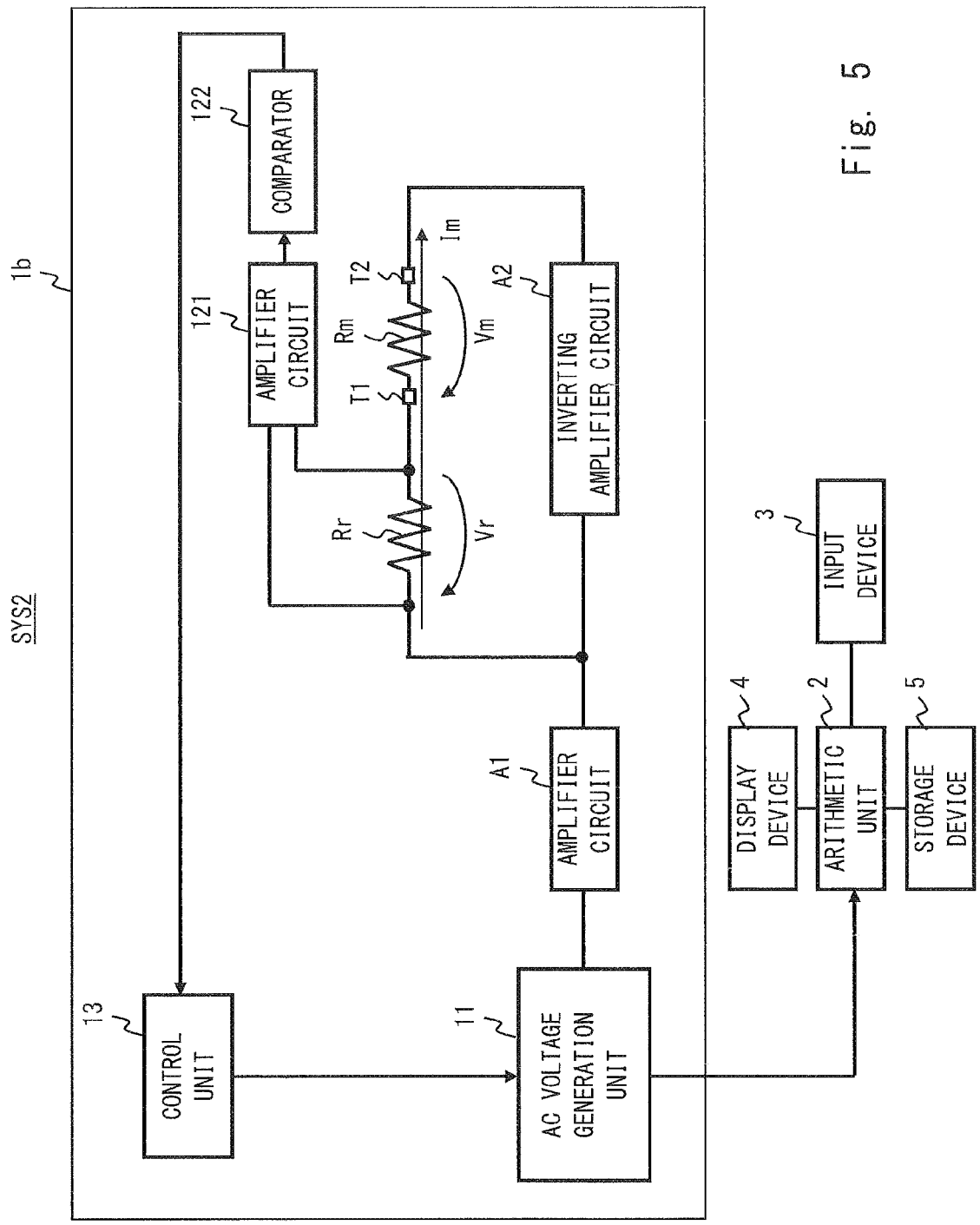
FIG. 5 is a diagram showing a configuration example of an AC resistance measuring system according to a second embodiment.

FIG. 5 is a diagram showing a configuration example of an AC resistance measuring system SYS2 according to a second embodiment. FIG. 5 shows a semiconductor device 1b as a specific configuration example of the semiconductor device 1.

As shown in FIG. 5, the AC resistance measuring system SYS2 includes the semiconductor device 1b, the arithmetic unit 2, the input device 3, the display device 4, and the storage device 5.

The semiconductor device 1b includes the amplifier circuit 121 and the comparator 122 as the voltage detecting unit 12, and further includes an amplifier circuit (forward amplifier circuit) A1 and an inverting amplifier circuit A2. Note that the voltage circuit 14 is not provided in the semiconductor device 1b.

Although the second embodiment illustrates an example in which the amplification circuit A1 and the inverting amplifier circuit A2 each have an amplification factor of 1, the present invention is not limited to this example. The amplification factors of the amplification circuit A1 and the inverting amplifier circuit A2 can be adjusted as needed for the purpose of, for example, suppressing the difference voltage Vr, which is generated between the two ends of the resistance element Rr, within a range of an allowable input voltage of the comparator 121.

The amplification circuit A1 amplifies the AC voltage Vg generated by the AC voltage generation unit 11, and outputs the amplified AC voltage. The inverting amplifier circuit A2 inverts and amplifies the output of the amplification circuit A1, and outputs the inverted and amplified output. Note that when the AC voltage generation unit 11 generates the AC voltage Vg by using a variable amplifier circuit, the inverting amplifier circuit A2 may be configured to directly invert and amplify the AC voltage Vg.

The output voltage of the amplification circuit A1 is applied to one end of a current path that passes through the resistance element Rr and the measurement target Rm (i.e., one end of the resistance element Rr in this case). The output voltage of the inverting amplifier circuit A2 is applied to the other end of the current path (i.e., the electrode T2 side of the measurement target Rm in this case). As a result, the alternating current Im flows through the resistance element Rr and the measurement target Rm.

The other components and operation of the semiconductor device 1b are similar to those of the semiconductor device 1, and thus a description thereof is omitted.

The relationship among the AC voltage Vg, the difference voltage Vr between the two ends of the resistance element Rr, and the difference voltage Vm between the two ends of the measurement target Rm (between the electrodes T1 and T2) is represented by the following Expression (5).

$$2Vg = Vr + Vm \quad (5)$$

The left-hand side of Expression (5) is 2Vg. This is because the AC voltage having the same phase as that of the AC voltage Vg is applied to one end (i.e., the resistance element Rr side) of a current path that passes through the resistance element Rr and the measurement target Rm, and the AC voltage having a phase opposite to that of the AC voltage Vg is applied to the other end (i.e., the measurement target Rm side) of the current path.

Note that the difference voltage Vr has reached the specified voltage Vref and is fixed (Vr≈Vref). Accordingly, the alternating current Im flowing through the resistance element Rr at this time is also fixed (Im≈Vr/Rr).

Since the alternating current Im flows through the measurement target Rm in the same manner as the alternating current Im flows through the resistance element Rr, the relationship among the resistance value (Rm) of the measurement target Rm, the alternating current Im, and the difference voltage Vm is represented by the following Expression (6).

$$Vm = Rm \times Im \quad (6)$$

After Expression (6) is substituted into Expression (5), Expression (7) is obtained.

$$2Vg = Vr + (Rm \times Im) \quad (7)$$

Based on Expression (7), the resistance value (Rm) of the measurement target Rm is represented by the following Expression (8).

$$Rm = (2Vg - Vr)/Im \quad (8)$$

As is seen from Expression (8), when the voltage detecting unit 12 detects that the difference voltage Vr has reached the specified voltage Vref, the difference voltage Vr indicates the specified voltage Vref and the alternating current Im indicates the value determined by Vr/Rr. Accordingly, the resistance value (Rm) of the measurement target Rm can be calculated merely by measuring the AC voltage Vg at that time. Further, the body composition can be estimated from the calculated resistance value Rm.

For example, assuming that the resistance value of the resistance element Rr is 100Ω, the value of the alternating current Im is 500 µArms (1.414 mApp), and the value of the AC voltage Vg is 250 mVpp, the resistance value (Rm) of the measurement target Rm is expressed as follows based on Expression (4).

$$Rm=\{2\times250[\text{mVpp}]-(100[\Omega]\times1.414[\text{mApp}])\}/1.414\,[\text{mApp}]=253.6[\Omega]$$

In this manner, the semiconductor device 1b and the AC resistance measuring system SYS2 including the semiconductor device 1b can provide the same effects as those of the semiconductor device 1a and the AC resistance measuring system SYS1 including the semiconductor device 1a. Further, if the semiconductor device 1b and the AC resistance measuring system SYS2 including the semiconductor device 1b have the same measurement accuracy as that of the semiconductor device 1a and the AC resistance measuring system SYS1 including the semiconductor device 1a, the range of the AC voltage Vg can be suppressed by about half, which enables operation at a low voltage.

Although the case where the amplification circuit A1 is provided has been described in the second embodiment, the present invention is not limited to this. When the AC voltage generation unit 11 generates the AC voltage Vg by using a variable amplifier circuit, the amplification circuit A1 is not necessarily provided. In this case, the inverting amplifier circuit A2 directly performs inversion amplification of the AC voltage Vg and outputs the inverted and amplified AC voltage. Further, the AC voltage Vg is directly applied to one end (i.e., the resistance element Rr side) of the current path that passes through the resistance element Rr and the measurement target Rm.

Third Embodiment

Figure 6:
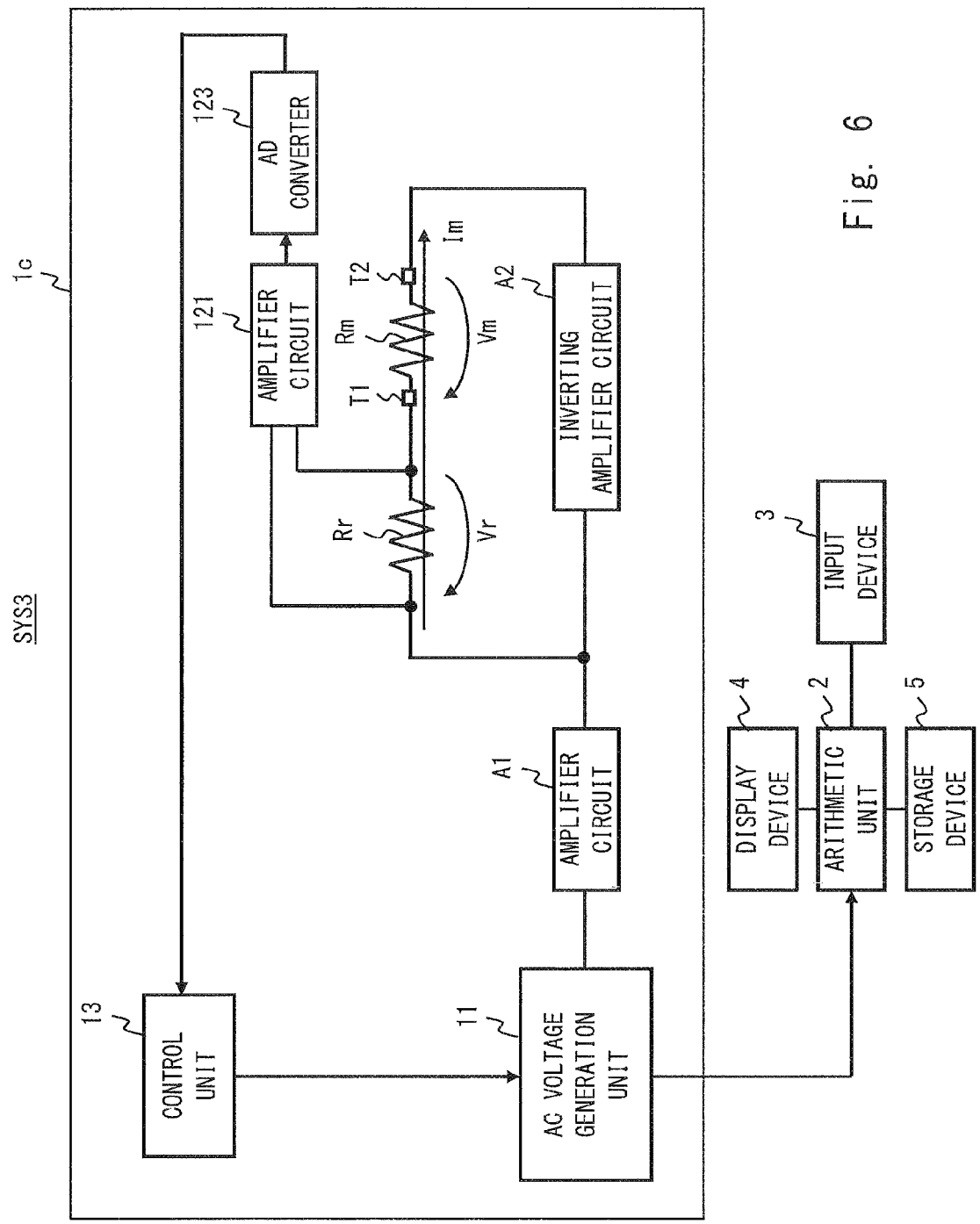
FIG. 6 is a diagram showing a configuration example of an AC resistance measuring system according to a third embodiment.

FIG. 6 is a diagram showing a configuration example of an AC resistance measuring system SYS3 according to a third embodiment. FIG. 6 shows a semiconductor device 1c as a specific configuration example of the semiconductor device 1.

The AC resistance measuring system SYS3 includes the semiconductor device 1c, the arithmetic unit 2, the input device 3, the display device 4, and the storage device 5. The semiconductor device 1c differs from the semiconductor device 1b in that the semiconductor device 1c includes the AD converter 123 instead of the comparator 122. The other components of the semiconductor device 1c and the AC resistance measuring system SYS3 including the semiconductor device 1c are similar to those of the semiconductor device 1b and the AC resistance measuring system including the semiconductor device 1b, and thus a description thereof is omitted. The AD converter 123 has also been described above.

The invention made by the present inventor has been described in detail above with reference to embodiments. However, the present invention is not limited to the above embodiments, and can be modified in various ways without departing from the scope of the invention.

For example, in the semiconductor devices according to the embodiments described above, the conductivity type (p-type or n-type) of a semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An AC resistance measuring system comprising:
   a semiconductor device comprising:
      an AC (Alternating Current) voltage generation unit that generates an AC voltage having an amplitude according to a control signal;
      a resistance element provided in series with a measurement target, the AC voltage being applied to the resistance element;
      a voltage detecting unit that detects that a difference voltage between two ends of the resistance element has reached a specified voltage; and
      a control unit that outputs the control signal to the AC voltage generation unit to cause the AC voltage generation unit to generate the AC voltage so that the difference voltage reaches the specified voltage, based on a detection result of the voltage detecting unit; and
   an arithmetic processing unit that calculates a resistance value of the measurement target,
   wherein the voltage detecting unit includes a comparator that compares the specified voltage with the difference voltage between the two ends of the resistance element, and
   wherein the resistance value of the measurement target is calculated by measuring the AC voltage obtained from information of a set value N of the AC voltage generation unit, where the set value N represents a magnitude of the amplitude of the AC voltage.

2. The AC resistance measuring system according to claim 1, wherein
   the voltage detecting unit further includes an amplifier circuit that amplifies the difference voltage between the two ends of the resistance element, and
   the comparator compares the specified voltage with an output voltage of the amplifier circuit.

3. The AC resistance measuring system according to claim 1, wherein the control unit outputs the control signal to cause the amplitude of the AC voltage to gradually increase, until the voltage detecting unit detects that the difference voltage has reached the specified voltage.

4. The AC resistance measuring system according to claim 1, wherein the AC voltage generation unit includes:
   an AC voltage source that generates an AC voltage having a predetermined amplitude; and
   a variable amplifier circuit that amplifies the AC voltage with an amplitude according to the control signal, or an attenuator that attenuates the AC voltage with an amplitude according to the control signal.

5. The AC resistance measuring system according to claim 1, wherein the AC voltage is applied to one end of a current path that passes through the resistance element and the measurement target, and a reference voltage is applied to the other end of the current path.

6. The AC resistance measuring system according to claim 5, further comprising a reference voltage generation circuit that applies the reference voltage to the other end of the current path.

7. The AC resistance measuring system according to claim 1, wherein the AC voltage is applied to one end of a current path that passes through the resistance element and the measurement target, and a voltage obtained by inverting the AC voltage is applied to the other end of the current path.

8. The AC resistance measuring system according to claim 7, further comprising:
a non-inverting amplifier circuit that amplifies the AC voltage and outputs the amplified AC voltage to one end of the current path; and
an inverting amplifier circuit that inverts and amplifies the AC voltage and outputs the inverted and amplified AC voltage to the other end of the current path.

9. The AC resistance measuring system according to claim 1,
wherein the arithmetic processing unit calculates the resistance value of the measurement target based on a value of the AC voltage, a resistance value of the resistance element, and a value of an alternating current flowing through the resistance element, the resistance value of the measurement target, the resistance value of the resistance element, and the value of the alternating current being measured when the voltage detecting unit detects that the difference voltage has reached the specified voltage.

10. The AC resistance measuring system according to claim 1, wherein the voltage detecting unit includes the comparator that compares the specified voltage with the difference voltage between the two ends of the resistance element to provide the detection result, and
wherein the control unit outputs the control signal to the AC voltage generation unit based on the detection result of the voltage detecting unit.

11. The AC resistance measuring system according to claim 1, wherein the voltage detecting unit detects whether the difference voltage between the two ends of the resistance element has reached the specified voltage to output the detection result including:
when the difference voltage has not reached the specified voltage, the voltage detecting unit sets the detection result to be inactive, and
when the difference voltage has reached the specified voltage, the voltage detecting unit sets the detection result to be active.

12. The AC resistance measuring system according to claim 1, wherein the comparator compares the specified voltage with a difference voltage between the two ends of the resistance element that is amplified.

13. The AC resistance measuring system according to claim 1, wherein the control unit that outputs the control signal to the AC voltage generation unit to cause the AC voltage generation unit to generate the AC voltage so that the difference voltage reaches the specified voltage, based on an updated value of the detection result of the voltage detecting unit in an analog domain.

14. The AC resistance measuring system according to claim 1, wherein the control unit outputs the control signal to the AC voltage generation unit to generate the AC voltage having an amplitude at which the detection result becomes active where the difference voltage reaches the specified voltage,
wherein the AC voltage generated by the AC voltage generation unit is according to the control signal from the control unit based according to the detection result when the difference voltage reaches the specified voltage, and
wherein the AC voltage is obtained from a final set value of the AC voltage generation unit, the final set value being when the difference voltage reaches the specified voltage, such that a resistance value of the measurement target is calculated from measuring the AC voltage in an analog domain.

15. An AC resistance measuring system comprising:
a semiconductor device comprising:
an AC (Alternating Current) voltage generation unit that generates an AC voltage having an amplitude according to a control signal;
a resistance element provided in series with a measurement target, the AC voltage being applied to the resistance element;
a voltage detecting unit detects whether a difference voltage between two ends of the resistance element has reached a predetermined voltage by comparing the predetermined voltage with the difference voltage between the two ends of the resistance element to provide a detection result; and
a control unit that outputs the control signal to the AC voltage generation unit to cause the AC voltage generation unit to generate the AC voltage so that the difference voltage reaches the predetermined voltage, based on the detection result of the voltage detecting unit; and
an arithmetic processing unit that calculates a resistance value of the measurement target,
wherein the resistance value of the measurement target is calculated by measuring the AC voltage obtained from information of a set value N of the AC voltage generation unit, where the set value N represents a magnitude of the amplitude of the AC voltage.

16. The AC resistance measuring system according to claim 15, wherein the voltage detection unit compares the predetermined voltage with a difference voltage between the two ends of the resistance element that is amplified through an amplifier to output the detection result to the control unit.

17. A semiconductor device comprising:
an AC (Alternating Current) voltage generation unit that generates an AC voltage having an amplitude according to a control signal;
a resistance element provided in series with a measurement target, the AC voltage being applied to the resistance element;
a voltage detecting unit that detects that a difference voltage between two ends of the resistance element has reached a specified voltage; and
a control unit that outputs the control signal to the AC voltage generation unit to cause the AC voltage generation unit to generate the AC voltage so that the difference voltage reaches the specified voltage, based on a detection result of the voltage detecting unit,
wherein the voltage detecting unit includes a comparator that compares the specified voltage with the difference voltage between the two ends of the resistance element,
wherein the AC voltage is applied to one end of a current path that passes through the resistance element and a measurement target, and a reference voltage is actively applied via a source to the other end of the current path, and wherein the voltage detecting unit further includes an amplifier circuit that amplifies the difference voltage between the two ends of the resistance element in an analog domain.

* * * * *